United States Patent [19]

Bouchard et al.

[11] 4,245,279

[45] Jan. 13, 1981

[54] PHOTOFLASH UNIT WITH INVERTED FLASHLAMPS

[75] Inventors: Andre C. Bouchard, Peabody, Mass.; Donald E. Armstrong, Williamsport; Ronald E. Sindlinger, Muncy, both of, Pa.; John W. Shaffer; Daniel W. Bricker, both of Williamsport, Pa.

[73] Assignee: GTE Products Corporation, Stamford, Conn.

[21] Appl. No.: 72,526

[22] Filed: Sep. 4, 1979

[51] Int. Cl.³ .................... F21K 5/02; G03B 15/02
[52] U.S. Cl. .................... 362/13; 362/237; 362/238; 362/240; 362/241; 362/247; 431/358; 431/359; 431/365
[58] Field of Search ............ 362/13, 346, 237, 238, 362/240, 241, 247; 431/358, 359, 365

[56] References Cited

U.S. PATENT DOCUMENTS

| 3,267,272 | 8/1966 | Fischer | 362/15 |
|---|---|---|---|
| 3,327,105 | 6/1967 | Kottler et al. | 362/11 |
| 3,598,984 | 8/1971 | Slomski | 362/15 |
| 3,608,451 | 9/1971 | Kelen | 362/13 |
| 3,937,946 | 2/1976 | Weber | 362/14 |
| 3,959,860 | 6/1976 | Schindler | 29/25.16 |
| 4,059,389 | 11/1977 | Armstrong et al. | 362/13 |
| 4,096,549 | 6/1978 | Anderson et al. | 431/359 |
| 4,101,259 | 7/1978 | Shaffer et al. | 431/359 |
| 4,101,260 | 7/1978 | Wanninkhof et al. | 431/359 |
| 4,136,377 | 1/1979 | Fohl | 362/13 |

FOREIGN PATENT DOCUMENTS 267323 12/1968 Austria .

Primary Examiner—Benjamin R. Padgett
Assistant Examiner—Irwin Gluck
Attorney, Agent, or Firm—Lawrence R. Fraley

[57] ABSTRACT

A multilamp photoflash unit including an elongated plastic housing having a longitudinal channel therein. Within the channel is positioned a thin, flat circuit board to which are connected several (e.g. six) flashlamps arranged in a linear array. The lamps are divided into two opposing pluralities such that those in the plurality being fired are inverted during firing.

10 Claims, 4 Drawing Figures

PHOTOFLASH UNIT WITH INVERTED FLASHLAMPS

DESCRIPTION

TECHNICAL FIELD

The present invention relates to disposable multilamp photoflash units and particularly to those which are electrically-activated.

Several varieties of electrically-activated, multilamp photoflash units are available today for camera users. Among these are the popular "flash-cube", the more recently introduced linear arrays known as "flash bars", and the vertically-oriented planar arrays commonly known as "flip-flash" devices. Examples of such units are illustrated in U.S. Pat. No. 3,327,105 (Kottler et al), 3,598,984 (Slomski), and 3,937,946 (Weber), respectively. As described therein, these units readily attach (e.g. by insertion within) to many of today's modern cameras and are activated by a suitable pulse provided by the camera's power source. The amount of energy required to accomplish this activation is dependent on the type of flashlamp utilized in the unit. In the industry, these are typically classified into two varieties: low-voltage and high-voltage. Low-voltage photoflash lamps typically include a glass envelope with a combustion-supporting gas (e.g. oxygen) and a quantity of filamentary, combustible material (e.g. shredded zirconium or bafnium) therein. A pair of electrically conductive lead-in wires are usually sealed in one end of the envelope and extend therein. A filament wire is utilized and inteconnects the extending ends of the lead-in wires. When the filament is heated by a firing current usually generated from a low-voltage source such as battery or charged capacitor (e.g. having a voltage of from about 1.5 to 15 volts), it ignites a primer material which then ignites the combustible material to produce a flash of light. Naturally, the oxygen gas aids in the above ignition.

High voltage photoflash lamps usually employ one of two ignition structures, both exclusive of the aforedescribed filament. In one embodiment a glass or ceramic bead is located within the envelope and contains extending ends of the lamp's conductive lead-in wires therein. A quantity of primer material occupies a surface of the bead and bridges portions of the leads which are located in the bead. Flashing of the lamp is achieved by application of a firing pulse approaching a few thousand volts across the portions of the lead-in wires which protrude from the envelope. The ignited primer material in turn ignites the combustible, filamentary zirconium material also used in lamps of this variety. An example of such a lamp is illustrated in U.S. Pat. No. 3,959,860 (Schindler). In another embodiment, the glass bead is excluded with the primer material being directly applied to spaced-apart, spherical terminations of the lead-in wires' extending ends. These terminations are previously covered with a porous glass coating. Ignition is achieved in a similar manner to that of the above beaded lamp, by application of a high voltage pulse across the two projecting lead-in wires. A spark discharge occurs between the two separate primer masses causing deflagration thereof and subsequent ignition of the adjacent zirconium or hafnium material. An example of a lamp utilizing such an ignition structure is illustrated in U.S. Pat. No. 4,059,389 (Armstrong et al). In yet another type of high voltage lamp, end portions of the lead-in wires are positioned on opposing sides of an indentation formed within the lamp's sealed end (bottom) portion with the primer material located within the indentation and interconnecting the two. Here also, combustible filamentary material is used and is ignited by the deflagrating primer. The teachings of the instant invention are particularly concerned with high voltage lamps, although it will be understood from the following that said teachings may be readily extended to lamps of the earlier generation, low voltage variety.

BACKGROUND

In the more recent multilamp units such as the "flip-flash" devices, it is desirable to connect the lamps therein in an electrical parallel arrangement. Accordingly, lamp flashing is accomplished in a sequential manner by a series of high voltage pulses impressed across one of the unit's input terminals. In such an arrangement, it is considered highly desirable that the spent (fired) lamp serve as an open-circuit switching element to thus assure that most or all of the subsequent firing pulse will not pass therethrough but instead will trigger the next, unfired lamp. Shorting of lamps as employed in the aforedescribed prior art devices was a ready possibility, however, in that droplets of incompletely burned zirconium or hafnium proved capable of physically bridging the lead-in wires within the lamp's envelope subsequent to lamp ignition. Various attempts to overcome this problem have included utilization of such additional structural parts as insulative glass sleeves (about one or both wires) or the aforedescribed glass or ceramic beads. Not only are lamps using such parts understandably more costly to produce, such lamps are also more difficult to fabricate using today's high-speed lamp manufacturing equipment. In addition, structures such as glass or ceramic beads failed to prove totally effective due to the droplets of conductive material being able on many occasions to settle around the region between the bead and lamp walls and still cause lead-in wire short-circuiting.

As an alternative means of assuring prevention of passage of subsequent firing pulses through a fired lamp, some circuit designs employ photo-sensitive switching members in the form of thin, plastic, metalized webs which each provide conductance to an adjacent lamp. Heat from the flashed lamp melts the web and thus removes the respective lamp from the circuit. The above switching components not only are relatively expensive but also require additional space in the unit's circuit, thus adding to the overall size of the unit.

It is believed therefore that a multilamp photoflash unit which is capable of assuring an open circuit for each fired lamp subsequent to said firing without the need for additional expensive parts as described above would institute an advancement in the art.

DISCLOSURE OF THE INVENTION

It is a primary object of the present invention to provide an electrically-activated, multilamp photoflash lamp unit which assures an open circuit for each lamp after flashing thereof.

It is another object of the invention to provide such a unit which can be readily produced economically and at high production rates.

It is another object of the invention to provide a unit of the variety described which is both compact in design and relatively simple to operate.

In accordance with one aspect of the invention, there is provided a multilamp photoflash unit comprising an elongated housing which defines two separate regions therein and a mounting device adjacent each region, two pluralities of flashlamps (each located in a respective one of the regions), and a coupling means for transmitting firing pulses from a camera's power source to both pluralities of flashlamps. The flashlamps each include the described combustible, filamentary material and are arranged in the unit such that the bottom (or press sealed end) portions of each lamp face away from the mounting device receiving the ignition pulses from the camera to which the unit is attached. Accordingly, each lamp is inverted when fired to thereby assure that non-burned combustible material will be prevented from short-circuiting the remaining portions of the lamp's lead-in wires by making physical contact therewith. As will be described, a surprising result of the above inverted arrangement is an increase in light output per lamp over similar lamps fired in the heretofore normal, upright manner.

BEST MODE FOR CARRYING OUT THE INVENTION

For a better understanding of the present invention together with other and further objects, advantages and capabilities thereof, reference is made to the following disclosure and appended claims in connection with the above described drawings.

Figures 1, 2:
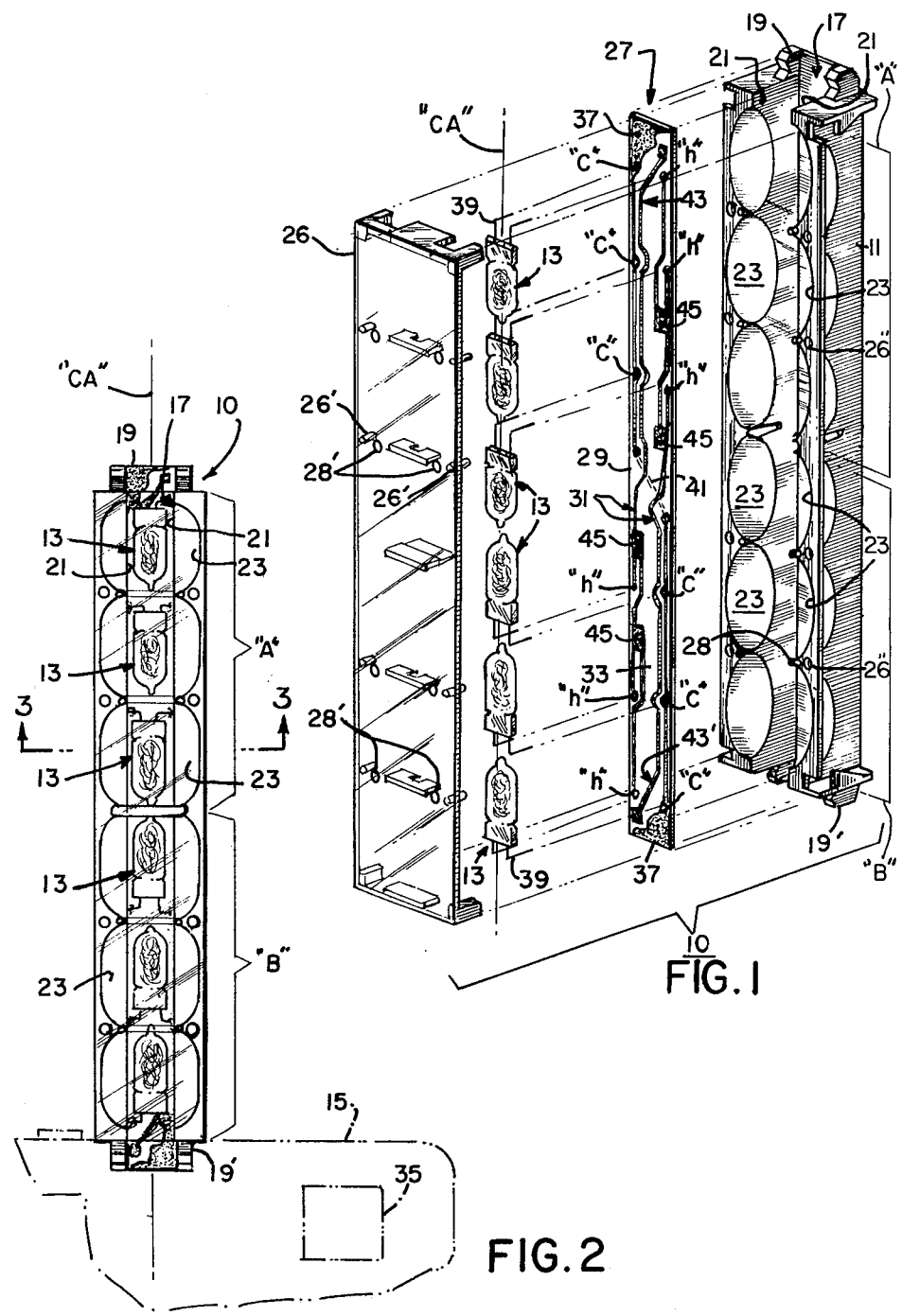
FIG. 1 is an exploded isometric view of a multilamp photoflash unit in accordance with a preferred embodiment of the invention.
FIG. 2 is a front elevational view of the unit of FIG. 1, as assembled, showing the unit in position on a camera.

With particular reference to both FIGS. 1 and 2, there is shown a multilamp photoflash unit 10 in accordance with a preferred embodiment of the invention. Unit 10 comprises an elongated housing 11 which defines therein first and second separate regions "A" and "B", respectively, each adapted for having a plurality of electrically-activated flashlamps 13 positioned therein. As shown in the drawings, each plurality includes three lamps although it is understood that this number can vary. For example, another embodiment of the invention included two lamps in each region. Unit 10 as illustrated thus includes a total of six lamps 13 available to the operator thereof when the invention is used with a respective camera 15 (shown in phantom in FIG. 2). Camera 15 may comprise any camera including a suitable socket for having unit 10 located therein and a power source associated therewith capable of providing a pulse sufficient to activate each lamp 13. Preferred examples include today's popular "pocket" cameras produced by Eastman Kodak, Rochester, New York. The power source typically associated with such cameras is a piezoelectric element (not shown) located within the camera and electrically joined to the socket. Accordingly, a pulse approaching several (e.g. four) thousand volts is supplied the socket, and therefor unit 10, when the camera operator depresses the camera's picture-taking lever or button. Understandably, this firing pulse is applied in synchronism with opening of the camera's shutter whereby the instantaneous, bright flash from the activated flashlamp can serve to illuminate the desired subject field.

Figure 3:
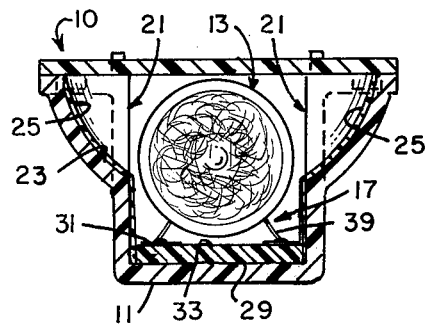
FIG. 3 is an elevational view, in section, of the invention as taken along the line 3—3 in FIG. 2.

Housing 11 includes a longitudinal channel 17 which runs the full length of the housing and is centrally located therein. Secured to or forming a part of opposing ends of housing 11 are two mounting devices 19 and 19' which are each adapted for being inserted within the corresponding socket of camera 15 to assure stable orientation of unit 10 atop the camera. As shown, channel 17 extends through each mounting device. Located along opposing upstanding side walls 21 within housing 11 are a plurality of recesses 23 which combine in the paired relationships illustrated to accommodate lamps 13. As shown each pair (two) of recesses align with a respective lamp in the finished product to thus serve as a reflector therefor. That is, each pair combines to define a parabolic reflecting cavity. Accordingly, the surfaces of each recess are preferably coated with a suitable reflective material (e.g. aluminum) to enhance light output from the lamp located adjacent thereto. This coating is illustrated as numeral 25 in FIG. 3. Unit 10 also includes a substantially planar light-transmitting panel 26 which secures to housing 11 to cover the unit's lamps 13. The light emitted from lamps 13 will thus pass through panel 26. Panel alignment and attachment to housing 11 is facilitated by utilization of a plurality of pins 26' which project from the panel and inset within corresponding apertures 26" within the housing. Attachment is also enhanced by provision of several upstanding projections 28 on housing 11 which mate with corresponding openings 28' in the panel.

Unit 10 also comprises a coupling means 27 for transmitting the aforedescribed lamp-firing pulses from the camera's piezoelectric unit to the lamps 13 designated for firing. In the case of the instant invention, coupling means 27 comprises an elongated printed circuit board 29 in the form of a planar strip adapted for being snugly positioned within channel 17 of housing 11. Ends of board 29 extend into mounting devices 19 and 19' such that when pulses are applied thereto, these pulses will be transmitted up the board's circuitry 31 (located on an upper, planar surface 33 of board 29) to the desired lamps. One of the primary functions of unit 10 is to substantially prevent the deleterious photographic condition referred to as "red-eye". "Red-eye" is a redness of the subject's pupils in the picture and results from the flash of light from the camera's flash unit entering the subject's pupils and illuminating the retinas in the eyes at regions approximately in line with the optical axis of the camera's lens. In other words, "red-eye" most usually occurs when the source of light used with the camera is too close to the camera's lens. Unit 10 substantially prevents this occurrence by locating lamps 13 a sufficient distance from the camera's lens 35 (FIG. 2) during firing thereof. That is, only the lamps in region "A" are flashed when unit 10 is located atop camera 15 with mounting device 19' inserted within the camera's socket. Similarly, only the lamps in region "B" are flashed when the unit is inverted and device 19 is inserted within the socket. In other words, first mounting device 19 is separated from the lamps in region "B" by the length of region "A" while device 19' is separated from the lamps in region "A" by the length of region "B", both of said lengths the approximate distance sufficient to prevent "red-eye".

The lamp-firing circuitry 31 of board 29 which assures the above described mode of operation can be defined as including three separate circuit paths. First, a single common path 37 is used to connect one lead-in wire 39 of each lamp at designated locations ("C"). With regard to the present invention, it is understood that wires 39 may be joined electrically to the respective locations on board 29 by any of several, various means, such as soldering. These locations are somewhat enlarged in comparison to the narrow-width circuit paths connecting said locations to facilitate connection of the leads thereto. Common path 37 is divided into two portions on surface 33 with each portion connecting a single lead from a respective plurality of lamps. The ends of these portions terminate on surface 33 at the approximate center of board 29 and are connected by a common circuit "jumper" 41 in the form of a bent metal wire which passes along the back of the board (on the surface opposite surface 33). Ends of "jumper" 41 preferably penetrate the board to effect this connection.

Circuitry 31 also includes two "hot" circuit paths 43 and 43'. Path 43 passes from the upper end (FIG. 1) of board 29 down to the lower portion thereof to electrically connect the remaining three leads of lamps 13 (at locations "h") within region "B" not joined to common path 37. Similarly, path 43' passes from the lower end (FIG. 1) of the board upwardly to connect the remainig leads of the lamps in region "A". Spaced along each path 43 and 43' is a pair of radiation switches 45 which may be comprised of any suitable material initially having an open circuit or high resistance. The resistance thereof becomes substantially zero or a very low value when the material receives radiation in the form of light and/or heat from an adjacent, flashed lamp 13. One example of such a material is silver oxide dispersed in a polyvinyl resin binder. As shown, a switch 45 is located adjacent the first two lamps to be fired in each plurality. A switch possessing this capability is understandably not needed adjacent the last lamp to be activated. The lamps in each region are therefore connected in parallel.

Operation of unit 10 first involves inserting one of the mounting devices 19 or 19' into the socket of camera 15. Assuming unit 10 is oriented as shown in FIG. 2 (with device 19' electrically connected to the camera's power source), the initial firing pulse from the power source will be directly applied to the first lamp in region "A" to effect ignition thereof. From the above description of circuitry 31, it is understood that this first lamp is the lower lamp of the three in the orientation depicted in FIGS. 1 and 2. Flashing of this lamp causes the adjacent radiation switch 45 to reach zero or very low resistance and thus connect the next (adjacent) lamp into the firing circuit for directly receiving the next pulse. Ignition of this lamp in turn causes the switch adjacent thereto to become conductive and connect the final (uppermost) lamp for flashing. Operation of the invention with regard to ignition of the lamps of region "B" is identical to that for the lamps of region "A" with the exception of course that the unit is inverted and device 19 inserted within the camera's socket. Added definition of this operation is therefore not believed necessary.

It can be understood from the foregoing that it is highly desirable that the first two lamps in each region must form an open circuit upon flashing thereof. Otherwise, said lamps can short-circuit the remaining, unfired lamps and prevent ignition thereof. As stated, it was heretofore deemed necessary to provide added components such as glass sleeves about the internal portions of the lamp's leads or highly expensive metallized web switching elements which melted open upon receipt of heat from a flashed lamp. The disadvantages of such components have been described. The instant invention assures this important open circuit feature without the need for added expensive and cumbersome components by orienting lamps 13 in housing 11 such that each lamp will be inverted during flashing thereof when unit 10 is substantially vertically positioned atop camera 15. Positioning photoflash units designed to prevent "red-eye" atop the camera in a vertical orientation represents the most preferred manner of operating such devices today. The new positioning relationship between lamp and camera during ignition not only prevents short circuits in flashed lamps (for reasons to be defined below) but also surprisingly results in an increase in total light output from each lamp in comparison to lamps fired in an upright manner. Additional significant features of the invention, including decreased switching times, will be described.

Figure 4:
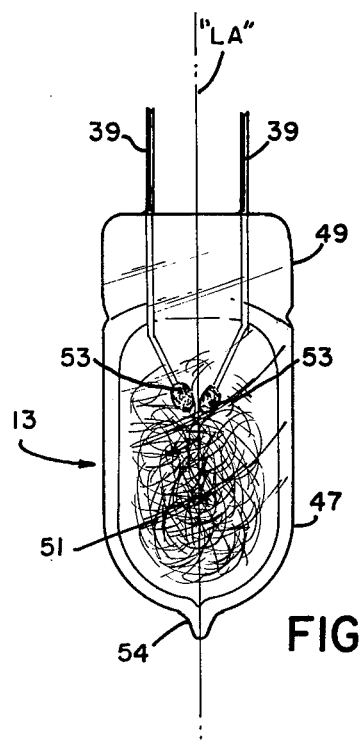
FIG. 4 is a front view, in section, of a flashlamp for use in the unit of FIG. 1.

With regard to the invention, by the term inverted is meant that the end of the lamp containing the conductive lead-in wires faces upwardly during lamp ignition. In the case of unit 10, this means that these ends face away from both the mounting device connected to camera 15 and the region of lamps not being fired (those closest to the camera). The lamps 13 of unit 10, as shown in FIG. 4, each include a hermetically sealed, light-transmitting envelope 47 of glass (e.g. borosilicate or soft glass) tubing having a presssealed end portion 49 containing both lead-in wires 39 therein. Lamp 13 also includes a tip portion 54 at an opposing end to sealed end 49. Ends 49 and 54 are formed using techniques well known in the industry and further description is not believed necessary. Envelope 47 preferably has a length of about 0.50 inch and an internal volume of less than one cubic centimeter. A quantity of filamentary combustible material 51, such as shredded zirconium or hafnium foil, is disposed within envelope 47. Also within the envelope is a filling of combustion-supporting gas, such as oxygen, established at a pressure of several atmospheres. The exterior surface of envelope 47 is also provided with a protective coating such as cellulose acetate (not shown).

Wires 39 form part of the lamp's ignition structure. The remaining part comprises a coating of primer material 53 over portions of each end of the lead-in wires which extend within envelope 47. As shown, these ends, including primer 53 thereon, are spaced apart in the finished product. It is also preferred to cover leads 39 with a porous glass coating (not shown) prior to application of primer 53. The preferred spacing should be a minimum of about 0.040 inch so that if no lead-in wire meltback occurs during flashing, the gap between the lead ends is sufficient to prevent subsequent high voltage arc over. If the leads melt back partially or completely, as often results, the meltback follows the illustrated sloped configuration of FIG. 4 thus increasing the gap between the internal leads. Operation of lamp 13 involves impressing a high voltage pulse (from the camera's piezoelectric crystal) across lead-in wires 39 to cause electrical breakdown of primer 53 and generation of a spark therebetween. Primer ignition causes deflagration thereof and instantaneous ignition of material 51. The result is a highly intense flash of light capable of sufficiently illuminating a subject field in front of camera 15.

Short circuiting by lamp 13 on circuit board 29 when fired in the inverted manner shown is prevented due to the gravitational influence on unburned droplets of the combustible material 51. In practically all lamp firing situations, such droplets occur and are readily capable of physically contacting and bridging the remaining end portions of leads 39 which extend within envelope 47. The instant invention eliminates this possibility in that unburned droplets are forced to fall to the lower tip portion 54 of the envelope where they typically cool and solidify in a relatively brief time period. It was also found that these droplets, when solidified, remained in tip portion 54 and did not fall toward sealed end 49 when lamp 13 was returned to a tip-up position.

As stated, it was also surprisingly determined that improvements in light output occurred when firing lamps 13 in an inverted manner. Utilizing high speed photography, it was observed that lamps fired in a tip up manner contained many droplets which generally moved in an upward direction during ignition. During this journey, influenced by surface tension forces with other shreds, some droplets collided with the interior walls of the lamp's envelope and caused light-absorbing encrustations thereon. At the approximate time of peak light output, these droplets began falling toward the press-sealed (lower) end now influenced totally by gravity. Unfortunately, these radiating droplets descended behind the aforementioned encrustations making their radiative properties substantially useless. Contrarily, lamps flashed in accordance with the teachings of the present invention contained droplets which moved only in a generally downward direction during flashing and thus left any encrusted glass surfaces behind (above). It is believed that the above phenomena is the primary reason for observed light output improvements. As an example of such improvements, increased light outputs ranging from two to ten percent were observed. Testing involved utilization of a photometer and a pulse integrator, with pains taken to assure that all tested lamps were measured in the same geometrical locations.

High speed photography also indicated that one reason for improved light output was the phenomenon of shred levitation above the lower tip portion, said levitation the result of surface tension (attraction) forces between the burning droplets and their respective unburned filament tails. The result of this action was a drawing away of the unburned shred mass from the heat-sinking tip portions. Accordingly, light output is increased due to the spaced positioning of the burning droplets from the interior surfaces of the heat-sinking glass envelope.

Another significant aspect of the improved switching action of the inverted lamps of the invention became evident when measuring electrical resistivity across lead-in wires 39 during and immediately after flashing. A multimeter (Simpson Model 260) in the resistance mode was connected across leads 39 and visually watched during lamp flashing. The multimeter's response was compared to responses for similar lamps fired tip-up. In the case of tip-up lamps, initial resistivity was very high (e.g. 100,000 ohms at 9 volts), dropped to almost zero during flashing, and in almost all instances, either returned to open circuit conditions very slowly (about 2 minutes) or remained conductive. Lamps remaining conductive were shorted electrically while those which slowly returned to open circuit conditions (high ohmic values) did so due to the phenomena that glass becomes quite conductive when heated to high temperatures. In tip-up fired lamps, the glass in the region (sealed end portion) containing the lamp's lead wires became very hot as a result of molten debris falling thereon. This action contrasts sharply with that of lamps of the invention which proved to switch almost instantaneously. That is, said lamps possessed a very high initial resistance (e.g. about 100,000 ohms), a resistance of only a few ohms during flashing, and returned to high resistance (about 100,000 ohms) instantly. One significant advantage of increased switching speed is that if two lamps are flashed in quick succession, the second pulse cannot pass through the fired lamp.

As illustrated in the drawings, flashlamps 13 of unit 10 are oriented in a linear array such that the longitudinal axes ("LA" in lamp 13 of FIG. 4) of all lamps occupy a common axis "CA" (FIGS. 1, 2). Each axis "LA" is also preferably parallel to the planar upper surface 33 of board 29. This arrangement assures both compactness and miniaturization for unit 10. For example, the six-lamp unit of FIG. 1 as assembled possesses an overall height of only about 5.57 inches, a width of only about 0.85 inch, and a thickness (depth) of only about 0.70 inch. A four-lamp embodiment, a designed to accommodate somewhat larger lamps than those of unit 10, possessed substantially similar dimensions. The lamps described above and shown in FIG. 4 possessed an average peak output of about 1250 beam candlepower-seconds with a peaking time of about 8 milliseconds. The preferred materials for use in unit 10 are: housing 11, polystyrene; cover panel 26, butadiene styrene thermoplastic; circuit board 29, medium or high impact polystyrene; and lamp-firing circuitry 31, aluminum. Remaining materials (e.g. those for lamps 13) have been listed.

Thus there has been shown and described a new and unique multilamp photoflash unit which possesses several advantageous features over prior art structures, including improved switching, simplicity of operation, enhanced light output per flash, and miniaturization. The invention as defined is also understandably cheaper to produce and readily capable of being manufactured at high production rates.

While there have been shown and described what are at present considered the preferred embodiments of the invention, it will be obvious to those skilled in the art that various changes and modifications may be made therein without departing from the scope of the invention as defined by the appended claims.

We claim:

1. A multilamp photoflash unit for being electrically activated when connected to a power source associated with a camera, said unit comprising:

an elongated housing defining first and second separate regions therein and including first and second mounting devices secured thereto or forming a part thereof for mounting said housing on said camera, said first and second mounting devices located adjacent said first and second separate regions, respectively, said first mounting device separated from said second region by said first region, said second mounting device separated from said first region by said second region;

first and second pluralities of electrically actuated flashlamps, each of said flashlamps including a light-transmitting envelope having a quantity of filamentary combustible material therein and a sealed end portion having a pair of conductive lead-in wires therein, said first plurality of flashlamps electrically connected together and positioned within said first region of said housing such that said sealed end portions of said envelopes thereof face away from said second regions, said second plurality of flashlamps electrically connected together and positioned within said second region of said housing such that said sealed end portions of said envelopes thereof face away from said first region; and coupling means for transmitting lamp-firing pulses applied by said camera power source from said second mounting device to said first plurality of flashlamps and from said first mounting device to said second plurality of flashlamps.

2. The photoflash unit according to claim 1 wherein said first and second pluralities of flashlamps are oriented in a linear array.

3. The photoflash unit according to claim 2 wherein each of said envelopes of said flashlamps includes a longitudinal axis, said flashlmaps oriented in said linear array such that said longitudinal axes of said envelopes occupy a common axis.

4. The photoflash unit according to claim 1 wherein said housing includes a longitudinal channel therein, said coupling means comprising an elongated printed circuit board located within said channel and including lamp-firing circuitry thereon, each of said flashlamps electrically connected to said circuitry.

5. The photoflash unit according to claim 4 wherein said elongated printed circuit board comprises a substantially planar strip member, each of said envelopes of said flashlamps including a longitudinal axis substantially parallel to said strip member.

6. The photoflash unit according to claim 5 wherein said flashlamps are oriented in a linear array in said housing such that said longitudinal axes of said envelopes occupy a common axis.

7. The photoflash unit according to claim 4 wherein said first plurality of flashlamps within said first region of said housing are electrically connected to said lamp-firing circuitry in a parallel arrangement for being sequentially fired upon receipt of sequential lamp-firing pulses from said second mounting device.

8. The photoflash unit according to claim 7 wherein said second plurality of flashlamps within said second region of said housing are electrically connected to said lamp firing circuitry in a parallel arrangement for being sequentially fired upon receipt of sequential lamp-firing pulses from said first mounting device.

9. The photoflash unit according to claim 1 wherein the number of lamps in each of said first and second pluralities of lamps is three.

10. The photoflash unit according to claim 1 further including a substantially planar, light-transmitting panel secured to said housing for covering said flashlamps located therein, the light emitted from said flashlamps during firing thereof passing through said panel.

* * * * *